US012615891B1

(12) United States Patent
Wang et al.

(10) Patent No.: US 12,615,891 B1
(45) Date of Patent: Apr. 28, 2026

(54) LIGHT-EMITTING DEVICE AND MANUFACTURING METHOD THEREFOR, AND DISPLAY PANEL

(71) Applicant: BOE Technology Group Co., Ltd., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 652 days.

(21) Appl. No.: 17/770,809

(22) PCT Filed: Jun. 4, 2021

(86) PCT No.: PCT/CN2021/098353
§ 371 (c)(1),
(2) Date: Apr. 21, 2022

(87) PCT Pub. No.: WO2021/254177
PCT Pub. Date: Dec. 23, 2021

(30) Foreign Application Priority Data

Jun. 17, 2020  (CN) .......................... 202010553773.8

(51) Int. Cl.
*H10H 20/832*          (2025.01)
*H10H 20/01*           (2025.01)
(Continued)

(52) U.S. Cl.
CPC ........ *H10H 20/835* (2025.01); *H10H 20/032* (2025.01); *H10H 20/831* (2025.01); *H10H 20/84* (2025.01)

(58) Field of Classification Search
None
See application file for complete search history.

(56) References Cited

U.S. PATENT DOCUMENTS

| | | | | |
|---|---|---|---|---|
| 9,059,339 B1* | 6/2015 | Bayram | ............... | H10H 20/824 |
| 2002/0149057 A1* | 10/2002 | Kawasaki | .......... | H10D 86/0225 |
| | | | | 257/E21.414 |

(Continued)

FOREIGN PATENT DOCUMENTS

| | | |
|---|---|---|
| CN | 101681877 A | 3/2010 |
| CN | 101867002 A | 10/2010 |

(Continued)

OTHER PUBLICATIONS

CN 202010553773.8 first office action.
PCT/CN2021/098353 international search report and written opinion.

*Primary Examiner* — Julio J Maldonado
*Assistant Examiner* — Pinaki Das
(74) *Attorney, Agent, or Firm* — IPro, PLLC

(57) ABSTRACT

A light-emitting device, a manufacturing method thereof and a display panel are provided. The light-emitting device includes a semiconductor structure, including: first semiconductor layer, light-emitting layer and second semiconductor layer arranged in stack; an insulating layer, having first, second and third barriers, the first barrier is disposed at outer sidewall of the semiconductor structure, the second barrier at least partially protrudes from central region of a surface of the second semiconductor layer, the third barrier and the second barrier are spaced apart; a first electrode, the first electrode covers surfaces of the first barrier and the third barrier not in contact with the semiconductor structure, and the first electrode is connected to the first semiconductor layer; and a second electrode, the second electrode covers the second barrier and is connected to the second semiconductor layer.

20 Claims, 3 Drawing Sheets

(51) Int. Cl.
    *H10H 20/831*       (2025.01)
    *H10H 20/84*        (2025.01)

(56)        References Cited

U.S. PATENT DOCUMENTS

| | | | |
|---|---|---|---|
| 2010/0163900 A1 | 7/2010 | Seo et al. | |
| 2010/0171135 A1* | 7/2010 | Engl | H10H 20/855 |
| | | | 257/E33.068 |
| 2012/0043572 A1* | 2/2012 | Engl | H10H 20/8312 |
| | | | 257/E33.072 |
| 2012/0211788 A1 | 8/2012 | Yuh et al. | |
| 2013/0313589 A1* | 11/2013 | Tomizawa | H10H 20/854 |
| | | | 257/98 |
| 2014/0374784 A1 | 12/2014 | Kim | |
| 2016/0099383 A1* | 4/2016 | Yuh | H10H 20/01 |
| | | | 438/22 |
| 2016/0197240 A1 | 7/2016 | Epler | |

FOREIGN PATENT DOCUMENTS

| | | | |
|---|---|---|---|
| CN | 103000777 A | 3/2013 | |
| CN | 103579447 A | 2/2014 | |
| CN | 103918092 A | 7/2014 | |
| CN | 104241493 A | 12/2014 | |
| CN | 104300056 A | 1/2015 | |
| CN | 108630793 A | 10/2018 | |
| CN | 109244204 A | 1/2019 | |
| CN | 111129246 A | 5/2020 | |
| CN | 111653653 A | 9/2020 | |
| WO | 2010111834 A1 | 10/2010 | |

* cited by examiner

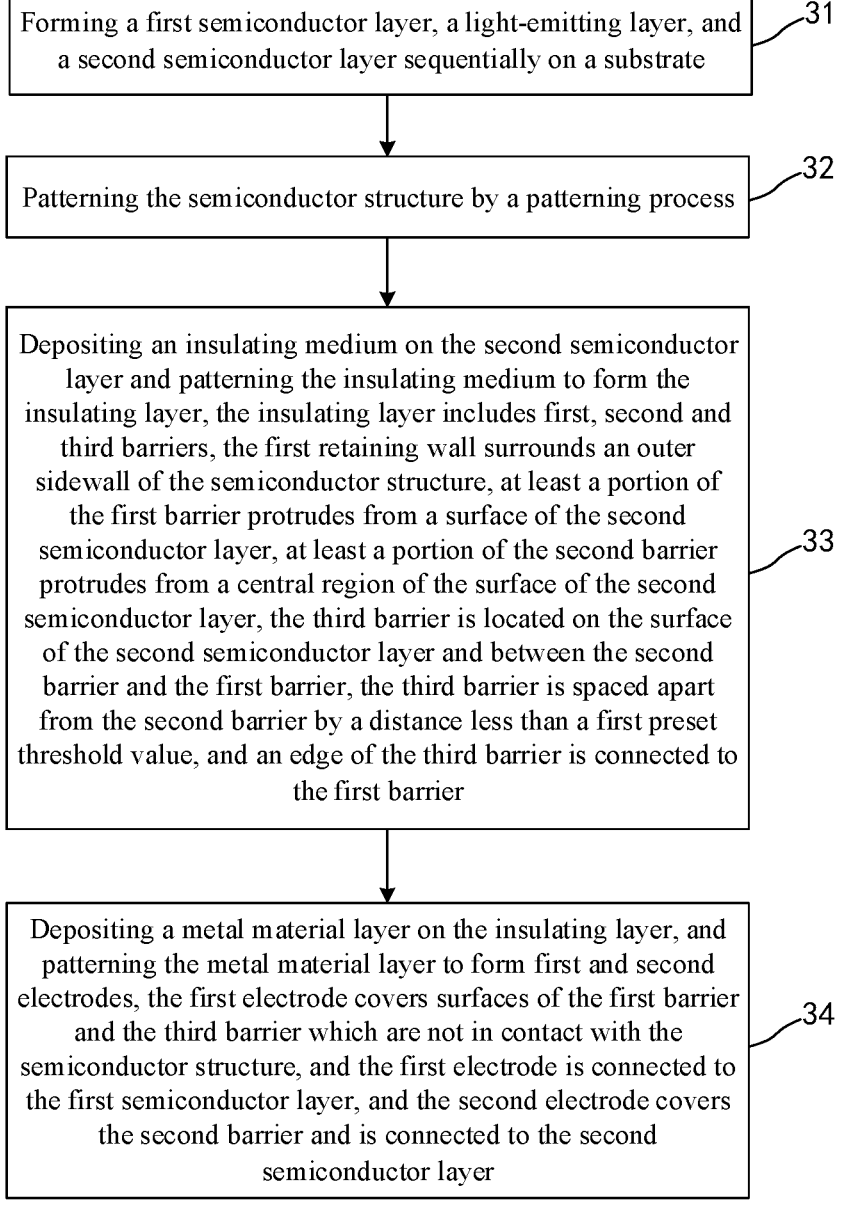

Forming a first semiconductor layer, a light-emitting layer, and a second semiconductor layer sequentially on a substrate ⟋31

Patterning the semiconductor structure by a patterning process ⟋32

Depositing an insulating medium on the second semiconductor layer and patterning the insulating medium to form the insulating layer, the insulating layer includes first, second and third barriers, the first retaining wall surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer and between the second barrier and the first barrier, the third barrier is spaced apart from the second barrier by a distance less than a first preset threshold value, and an edge of the third barrier is connected to the first barrier ⟋33

Depositing a metal material layer on the insulating layer, and patterning the metal material layer to form first and second electrodes, the first electrode covers surfaces of the first barrier and the third barrier which are not in contact with the semiconductor structure, and the first electrode is connected to the first semiconductor layer, and the second electrode covers the second barrier and is connected to the second semiconductor layer ⟋34

Fig. 3

LIGHT-EMITTING DEVICE AND MANUFACTURING METHOD THEREFOR, AND DISPLAY PANEL

CROSS-REFERENCE TO RELATED APPLICATIONS

The present application is the U.S. national phase of PCT Application No. PCT/CN2021/098353 filed on Jun. 4, 2021, which claims priority to Chinese Patent Application No. 202010553773.8 filed in China on Jun. 17, 2020, which is incorporated herein by reference in its entirety.

TECHNICAL FIELD

The present disclosure relates to the field of displaying technology, and in particular to, a light-emitting device and a manufacturing method thereof, and a display panel.

BACKGROUND

The LED display technology has become one of promising future display techniques. The Micro LED display technology has characteristics such as independent pixel control, independent light-emitting control, high luminance, low power consumption, ultra-high resolution, high color gamut, and so on.

SUMMARY

In an aspect, embodiments of the present disclosure provide a light-emitting device, which includes a semiconductor structure, the semiconductor structure includes a first semiconductor layer, a light-emitting layer, and a second semiconductor layer arranged in a stack, and the light-emitting device further includes:

an insulating layer, where the insulating layer includes a first barrier, a second barrier and a third barrier, the first barrier surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer, the third barrier is located between the second barrier and the first barrier, the third barrier is spaced apart from the second barrier by a distance less than a first preset threshold value, and an edge of the third barrier is connected to the first barrier;

a first electrode, where the first electrode covers surfaces of the first barrier and the third barrier which are not in contact with the semiconductor structure, and the first electrode is connected to the first semiconductor layer; and a second electrode, where the second electrode covers the second barrier and is connected to the second semiconductor layer.

Optionally, the first semiconductor layer includes a doped structure located at an edge region of the first semiconductor layer, and the first barrier surrounds a part of an outer sidewall of the first semiconductor layer close to the light-emitting layer, and surrounds an entire sidewall of the light-emitting layer and an entire sidewall of the second semiconductor layer; the first electrode is connected to the doped structure, and an outer sidewall of the doped structure is not surrounded by the first barrier.

Optionally, the doped structure protrudes from the first semiconductor layer in a direction of the outer sidewall of the first semiconductor layer, and the first electrode is connected, in an overlapping manner, with a surface of the doped structure on a side close to the light-emitting layer.

Optionally, the doped structure is a heavily doped structure.

Optionally, the first electrode and the second electrode are made of a metal having a light reflectivity of 90% or more.

Optionally, the first electrode and the second electrode is a single-layer structure.

Optionally, the first electrode and the second electrode is a dual-layer structure, where one layer is a first metal layer having a light reflectivity of 90% or more, and the other layer is a second metal layer having hardness higher than a second preset threshold.

Optionally, orthographic projections of the first electrode and the second electrode onto the surface of the second semiconductor layer occupy 90% or more of an area of a bottom surface of the second semiconductor layer.

Optionally, the first barrier and the third barrier are formed as an integral structure.

Optionally, the second barrier includes two sub-barriers arranged at an interval.

Optionally, the light-emitting device has a cylindrical shape, a portion of the first electrode protruding from the surface of the second semiconductor layer has a hollow cylindrical shape, and the second electrode has a hollow cylindrical shape.

Optionally, an orthographic projection of the first electrode onto the substrate is a ring, an orthographic projection of the second electrode on the substrate is a circle, and the orthographic projection of the first electrode onto the substrate surrounds the orthographic projection of the second electrode onto the substrate.

In another aspect, embodiments of the present disclosure also provide a method for manufacturing the light-emitting device, which includes:

forming a first semiconductor layer, a light-emitting layer, and a second semiconductor layer sequentially on the substrate; where the first semiconductor layer, the light-emitting layer and the second semiconductor layer form the semiconductor structure;

patterning the semiconductor structure by a patterning process;

depositing an insulating medium on the second semiconductor layer, and patterning the insulating medium to form an insulating layer, where the insulating layer includes a first barrier, a second barrier and a third barrier, the first barrier surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer, the third barrier is located between the second barrier and the first barrier, the third barrier is spaced apart from the second barrier by a distance less than a first preset threshold value, and an edge of the third barrier is connected to the first barrier; and depositing a metal material layer on the insulating layer, and patterning the metal material layer to form a first electrode and a second electrode, where the first electrode covers surfaces of the first barrier and the third barrier which are not in contact with the semiconductor structure, the first electrode is connected to the first semiconductor layer, and the second electrode covers the second barrier and is connected to the second semiconductor layer.

Optionally, the patterning the semiconductor structure by a patterning process includes:

etching, in a direction from the second semiconductor layer to the first semiconductor layer, the second semiconductor layer, the light-emitting layer and part of the first semiconductor layer sequentially to form the first semiconductor layer of a preset thickness on the substrate; and the manufacturing method further includes:

doping the first semiconductor layer of a preset thickness by an ion implantation process, where the implanted ions diffuse to an edge region of the first semiconductor layer between the light-emitting layer that is patterned and the substrate, to form a doped structure in the first semiconductor layer.

Optionally, the method further includes: performing a high-temperature annealing treatment on the semiconductor structure on which the ion implantation process has been performed.

Optionally, in the ion implantation process, a concentration of phosphorus in a precursor is within a range of 10% to 15%, and an annealing temperature is within a range of 800 degrees Celsius to 1000 degrees Celsius.

In yet another aspect, embodiments of the present disclosure further provides a display panel, which includes the light-emitting device as described above.

Optionally, the display panel further includes a display back plate and a plurality of light-emitting devices arranged in an array on the display back plate, and each of the plurality of light-emitting devices is bonded to a power supply pad on the display back plate via the first electrode and the second electrode, so as to electrically connect the display back plate to each of the plurality of the light-emitting device.

BRIEF DESCRIPTION OF THE DRAWINGS

FIG. 3 is a schematic flow chart showing a method for manufacturing a light-emitting device provided by an embodiment of the present disclosure;

DETAILED DESCRIPTION

To make the objectives, features and advantages of the embodiments of the present disclosure clearer, the technical solution according to embodiments of the present disclosure will be clearly and completely described hereinafter in conjunction with drawings for the embodiments of the present disclosure. It should be understood that the described embodiments are only part of, rather than all of embodiments of the present disclosure. All other embodiments obtained by those skilled in the art based on embodiments of the present disclosure fall within the protection scope of this disclosure.

The technique of the bonding between a Micro LED and the back plate determines a yield of the product and a difficulty in repairing it. Currently, a conventional technique includes manufacturing, after a light-emitting device has been manufactured, micro-tubes at an N-type semiconductor end and a P-type semiconductor end for bonding to a display panel. However, such a design needs to sacrifice a certain light-emitting area, thereby reducing the brightness of the light-emitting device.

With respect to the above-mentioned technical issues, the present disclosure provides a light-emitting device, a manufacturing method thereof and a display panel, which can address the technical issue in the related art that a certain light-emitting area needs to be sacrificed when designing electrodes of the light-emitting device, resulting in a decreased brightness of the light-emitting device.

Figure 1:
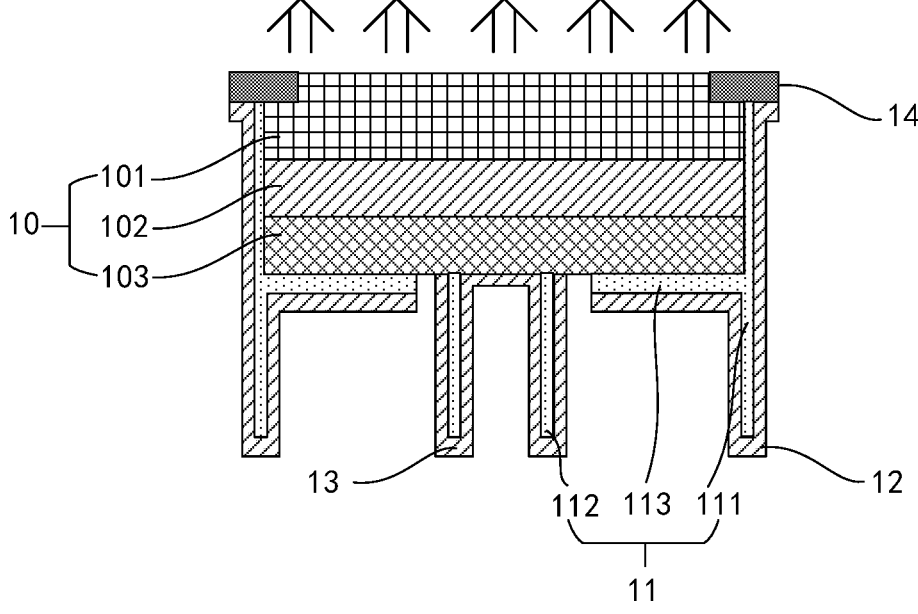
FIG. 1 is a schematic structural diagram of a light-emitting device provided by an embodiment of the present disclosure.

Reference is made to FIG. 1, which is a schematic structural diagram of a light-emitting device provided by an embodiment of the present disclosure.

As shown in FIG. 1, in the embodiment of the present disclosure, the light-emitting device may include a semiconductor structure 10, the semiconductor structure 10 may specifically include a stack arrangement of a first semiconductor layer 101, a light-emitting layer 102, and a second semiconductor layer 103.

The first semiconductor layer 101 and the second semiconductor layer 103 may be made of GaN. In an embodiment of the present disclosure, the first semiconductor layer 101 is made of n-GaN and functions as an N-type semiconductor layer, and the second semiconductor layer 103 is made of p-GaN and functions as a P-type semiconductor layer. Of course, the first semiconductor layer 101 and the second semiconductor layer 103 in the present disclosure are not limited to the GaN material, and may also be InGaN, AlInGaAs, or other materials. The light-emitting layer 102 may be a quantum well layer, such as a multi-quantum well, for limiting holes of the P-type material and electrons of the N-type material, which in turn enhances a light-emitting efficiency.

In an embodiment of the present disclosure, the light-emitting device further includes an insulating layer 11. The insulating layer 11 may specifically include a first barrier 111, a second barrier 112, and a third barrier 113. The first barrier 111 surrounds an outer sidewall of the semiconductor structure 10, and at least a portion of the first barrier 111 protrudes from a surface of the second semiconductor layer 103. In other words, the first barrier 111 not only surrounds the semiconductor structure 10, but also further extends in the thickness direction of the semiconductor structure 10, such that the first barrier 111 partially protrudes from the surface of the second semiconductor layer 103. The second barrier 112 is provided at the central region of the surface of the second semiconductor layer 103, and the second barrier 112 at least partially protrudes from the surface of the second semiconductor layer 103. The third barrier 113 is arranged on the surface of the second semiconductor layer 103 and is located between the second barrier 112 and the first barrier. The third barrier 113 is spaced apart from the second barrier 112 by a distance which is less than a first preset threshold, and an edge of the third barrier 113 is connected to the first barrier 111.

In some embodiments, in the cross-sectional view, the first barrier 111 and the third barrier 113 forms two "T"-shaped structures which are arranged along a horizontal direction and are oppositely disposed, while the second barrier 112 includes two parallel bar-shaped structures in the vertical direction (parallel to the thickness direction of the semiconductor structure 10).

In some embodiments, the first barrier and the third barrier are formed as an integral structure.

In some embodiments, the second barrier includes two sub-barriers spaced apart.

The insulating layer 11 has following functions: patterning when forming a conductive electrode of the semiconductor structure 10; separating the electrode from the semiconductor structure 10; and in addition, improving the light-emitting efficiency of the light-emitting device. The light-emitting efficiency is improved because the insulating layer 11 covers most of surfaces of the semiconductor structure 10, which means that the electrode also covers most of the surfaces of the semiconductor structure 10, so that almost only a surface of the first semiconductor layer 101 is exposed, and the light generated by the semiconductor structure 10 is substantially emitted from a side of the semiconductor structure 10 where the surface of the first semiconductor layer 101 is located. In an embodiment of the present disclosure, The insulating layer 11 may be made of $SiO_x$.

In an embodiment of the present disclosure, the light-emitting device further includes a first electrode 12 and a second electrode 13. The first electrode 12 covers surfaces of the first barrier 111 which are not in contact with the semiconductor structure 10, and covers a surface of the third barrier 113 which is not in contact with the semiconductor structure 10. The first electrode 12 is connected to the first semiconductor layer 101. In other words, the first electrode 12 surrounds an outer sidewall of the first barrier 111, a portion of the first barrier 111 protruding from the surface of the second semiconductor layer 103, and the surface of the third barrier 113, so that a portion of the first electrode 12 protruding from the surface of the second semiconductor layer 103 may function as a connection point to be connected to a power supply pad on the back plate. The second electrode 13 covers the second barrier 112 and is connected to the surface of the second semiconductor layer 103, so that a portion of the second electrode 13 protruding from the second semiconductor layer 103 may function as a connection point to be connected to the power supply pad on the back plate. In an embodiment of the present disclosure, the first electrode 12 and the second electrode 13 may function as a positive electrode and a negative electrode of the light-emitting device, which are to be connected to a power supply positive electrode and a power supply negative electrode on the back plate, respectively, so that a current can be supplied to the light-emitting device to enable the light-emitting device being powered for light-emitting.

In an embodiment of the present disclosure, because the first electrode 12 and the second electrode 13 cover most of the surfaces of the semiconductor structure 10, and almost only the surfaces of the first semiconductor layer 101 is exposed, the light generated by the semiconductor structure 10 is almost emitted from the side of the semiconductor structure 10 where the surface of the first semiconductor layer 101 is located, thereby improving the light-emitting efficiency of the light-emitting device.

In the above description, the third barrier 113 is separated from the second barrier 112 at a spacing position, which enables the first electrode 12 and the second electrode 13 to be disconnected at the spacing position when forming the first electrode 12 and the second electrode 13 by deposition, thereby preventing the first electrode 12 and the second electrode 13 from being short-circuited. A distance for the spacing position is set to be less than a first preset threshold value. The first preset threshold value is to be set as smaller as possible while ensuring that no short circuit may occur, so that the first electrode 12 and the second electrode 13 can cover a certain area of the surface of the second semiconductor layer 103. In addition, the first electrode 12 and the second electrode 13 do not occupy a light-emitting area of the semiconductor structure 10, so that when the light-emitting device generates light, and the light reaches the first electrode 12 and the second electrode 13 on the surface of the second semiconductor layer 103, said light will be reflected back, so that most of the light generated by the light-emitting device will emit from the surface of the first semiconductor layer 101 (as indicated by arrows in FIG. 1) without emitting from the outer sidewalls and the bottom surface of the semiconductor structure 10, thereby greatly improving the light-emitting efficiency of the light-emitting device.

In some embodiments, the first electrode 12 and the second electrode 13 are made of a metal material. By shielding most of the surface of the light-emitting device with the metal used for manufacturing the electrodes, the light reaching the metal electrodes can be reflected, such that the light generated by the light-emitting device can be concentrated to be emitted from the top of the light-emitting device, thereby improving the luminous intensity of the light-emitting device and reducing the power consumption of the back plate.

Figure 2:
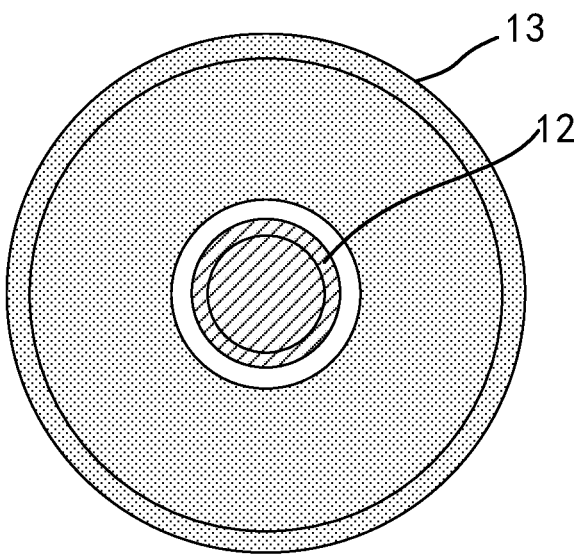
FIG. 2 is a schematic bottom view of a light-emitting device provided by an embodiment of the present disclosure.

Reference is made to FIG. 2, which is a schematic bottom view of the light-emitting device provided by an embodiment of the present disclosure. As shown in FIG. 2, in the embodiment of the present disclosure, the light-emitting device may have a substantially cylindrical shape, so that a portion of the first electrode 12 protruding from the surface of the second semiconductor layer 103 may also has a hollow cylindrical shape, and the second electrode 13 may also has a hollow cylindrical shape (a portion of the second electrode 13 that is in contact with the second semiconductor layer 103 is closed to improve contact conductivity). It may be understood that the light-emitting device may also have a cuboid shape, a cube shape, a regular hexagonal prism shape and the like, and the shape of the light-emitting device may be varied according to actual requirements, and the present disclosure is not limited thereto.

In some embodiments, an orthographic projection of the first electrode onto the substrate is a ring, an orthographic projection of the second electrode onto the substrate is a circle, and the orthographic projection of the first electrode onto the substrate surrounds the orthographic projection of the second electrode onto the substrate, Since the first barrier 111 at least partially protrudes from the surface of the second semiconductor layer 103, the first electrode 12 coated outside the first barrier 111 may also partially protrude from the surface of the second semiconductor layer 103, for example, the first electrode 12 may have an arc-shaped surface (namely, a part of a sidewall of hollow cylinder is cut away in the axial direction). Similarly, since the second barrier 112 at least partially protrudes from the central region of the surface of the second semiconductor layer 103, the second electrode 13 coated outside the second barrier 112 may also partially protrude from the surface of the second semiconductor layer 103, for example, the second electrode 13 may also have an arc-shaped surface. For the first electrode 12 and the second electrode 13 having the arc-shaped surface, some metal materials can be omitted, while an area where the first electrode 12 and the second electrode 13 having the cylindrical shape contact with the power supply pad on the back plate is relatively large, resulting in a relatively good electrical conductivity.

In some embodiments of the present disclosure, the first semiconductor layer 101 includes a doped structure 14 located at an edge region of the first semiconductor layer 101, and specifically, the first barrier 111 surrounds an outer sidewall of a portion of the first semiconductor layer 101 that is close to the light-emitting layer 102, and the entire outer sidewall of the light-emitting layer 102 and the entire outer sidewall of the second semiconductor layer 103, wherein the first electrode is connected to the doped structure, and the outer sidewall of the doped structure is not surrounded by the first barrier.

That is to say, a portion of the outer sidewall of the first semiconductor layer 101 away from the light-emitting layer 102, which is not covered by the first barrier 111, is formed as the doped structure 14, and the first electrode 12 is connected to the first semiconductor layer 101 through the doped structure 14. The portion formed as the doping structure 14 may reduce the contact resistance between the first electrode 12 and the first semiconductor layer 101, thereby improving the light-emitting efficiency of the light-emitting device.

In some embodiments of the present disclosure, the doped structure protrudes from the first semiconductor layer in the direction of the outer sidewall of the first semiconductor layer, and the first electrode is connected with a surface of the doped structure on a side close to the light-emitting layer in an overlapping manner.

In some embodiments of the present disclosure, the doped structure 14 is formed as a heavily doped structure, the heavily doped structure has a relatively good conductivity, resulting in a lower contact resistance between the first electrode 12 and the first semiconductor layer 101, and thus a high light-emitting efficiency of the light-emitting device.

In some embodiments of the present disclosure, the first electrode 12 and the second electrode 13 are made of a metal material, and more specifically, the metal material has a light reflectivity of 90% or more. Since the first electrode 12 and the second electrode 13 may substantially cover the outer sidewall(s) and the bottom surface of the semiconductor structure 10, when the light-emitting device generates light and the light then reaches the first electrode 12 and the second electrode 13 on the surface of the second semiconductor layer 103, said light can be efficiently reflected back, so that most of the light generated by the light-emitting device can emit from the surface of the first semiconductor layer 101 without exiting from the outer sidewall(s) and the bottom surface of the semiconductor structure 10, thereby greatly improving the light-emitting efficiency of the light-emitting device.

In some embodiments of the present disclosure, the first electrode and the second electrode have a single-layer structure. That is, the first electrode 12 and the second electrode 13 are in one metal layer made of the metal material having a light reflectivity of 90% or more.

In some embodiments of the present disclosure, the first electrode and the second electrode have a dual-layer structure, in which one layer is a first metal layer having the light reflectivity of 90% or more, and the other layer is a second metal layer having hardness higher than a second preset threshold.

In some embodiments of the present disclosure, the second metal layer is arranged on the insulating layer, the first metal layer is arranged on a side of the second metal layer away from the insulating layer, and the first metal layer and the second metal layer are superimposed with each other.

In an embodiment of the present disclosure, an orthographic projection of the first electrode 12 and an orthographic projection of the second electrode 13 onto the surface of the second semiconductor layer 103 occupy 90% or more of the area of the bottom surface of the second semiconductor layer 103.

In other words, the surface of the second semiconductor layer 103 on a side the second semiconductor layer 103 away from the light-emitting layer 12 is the bottom surface, and the first electrode 12 and the second electrode 13 both cover some of the bottom surface of the second semiconductor layer 103, and the orthographic projection of the first electrode 12 and the orthographic projection of the second electrode 13 onto the bottom surface of the second semiconductor layer 103 occupy 90% or more of the area of the bottom surface of the second semiconductor layer 103.

A portion of the second semiconductor layer 103 which is not covered by the first electrode 12 and the second electrode 13 is an area of the spacing between the above-mentioned first electrode 12 and second electrode 13. By changing the spacing distance between the first electrode 12 and the second electrode 13, a ratio of an area of the orthographic projections of the first electrode 12 and the second electrode 13 onto the surface of the second semiconductor layer 103 to an area of the bottom surface of the second semiconductor layer 103 may be changed. By controlling the ratio, it may be ensured that most of the light generated by the light-emitting device is emitted from the surface of the first semiconductor layer 101. Even if the light is emitted from the surface of the second semiconductor layer 103; the light can be reflected back by the first electrode 12 and the second electrode 13 which have a high coverage ratio of said surface, so that the light-emitting efficiency of the light-emitting device can be improved.

In the light-emitting device according to the embodiments of the present disclosure, most of the surfaces of the semiconductor layer are covered with the electrode made of the metal material, and the brightness of the light-emitting device can be effectively improved by reflecting light reaching the side surface and the bottom surface with the electrode without increasing the supplied power, thereby reducing power consumption of the back plate.

Reference is made to FIG. 3, which is a schematic flow chart showing a method for manufacturing a light-emitting device provided by an embodiment of the present disclosure.

The method for manufacturing the light-emitting device is for manufacturing the light-emitting device in the above-mentioned embodiments, and the method may include the following steps.

In step 31, a first semiconductor layer, a light-emitting layer, and a second semiconductor layer are formed on the substrate in the sequence listed, where the first semiconductor layer, the light-emitting layer, and the second semiconductor layer form the semiconductor structure.

In step 32, the semiconductor structure is patterned in a patterning process.

In step 33, an insulating medium is deposited on the second semiconductor layer, and then patterned to form an insulating layer. The insulating layer includes a first barrier, a second barrier and a third barrier. The first barrier surrounds an outer sidewall of the semiconductor structure. At least a portion of the first barrier protrudes from a surface of the second semiconductor layer, and at least a portion of the second barrier protrudes from a central region of the surface of the second semiconductor layer. The third barrier is located on the surface of the second semiconductor layer, and the third barrier is located between the second barrier and the first barrier. The third barrier is spaced apart from the second barrier by a spacing distance, the spacing distance is less than a first preset threshold value. An edge of the third barrier is connected to the first barrier.

In step 34, the metal material layer is deposited on the insulating layer, and then patterned to form the first electrode and the second electrode. The first electrode covers surface(s) of the first barrier and surface(s) of the third barrier, which surfaces are not in contact with the semiconductor structure. The first electrode is connected to the first semiconductor layer. The second electrode covers the second barrier, and is connected to the second semiconductor layer.

In the embodiments of the present disclosure, by covering most of the surfaces of the semiconductor layer in the process of manufacturing the electrodes, the brightness of the light-emitting device can be effectively increased by reflecting the light incident on the side surface and the bottom surface back with the electrodes without increasing the supplied power, thereby reducing the power consumption of the back plate.

The method for manufacturing the light-emitting device is described hereinafter with reference to the specific structural diagrams.

Figure 4:
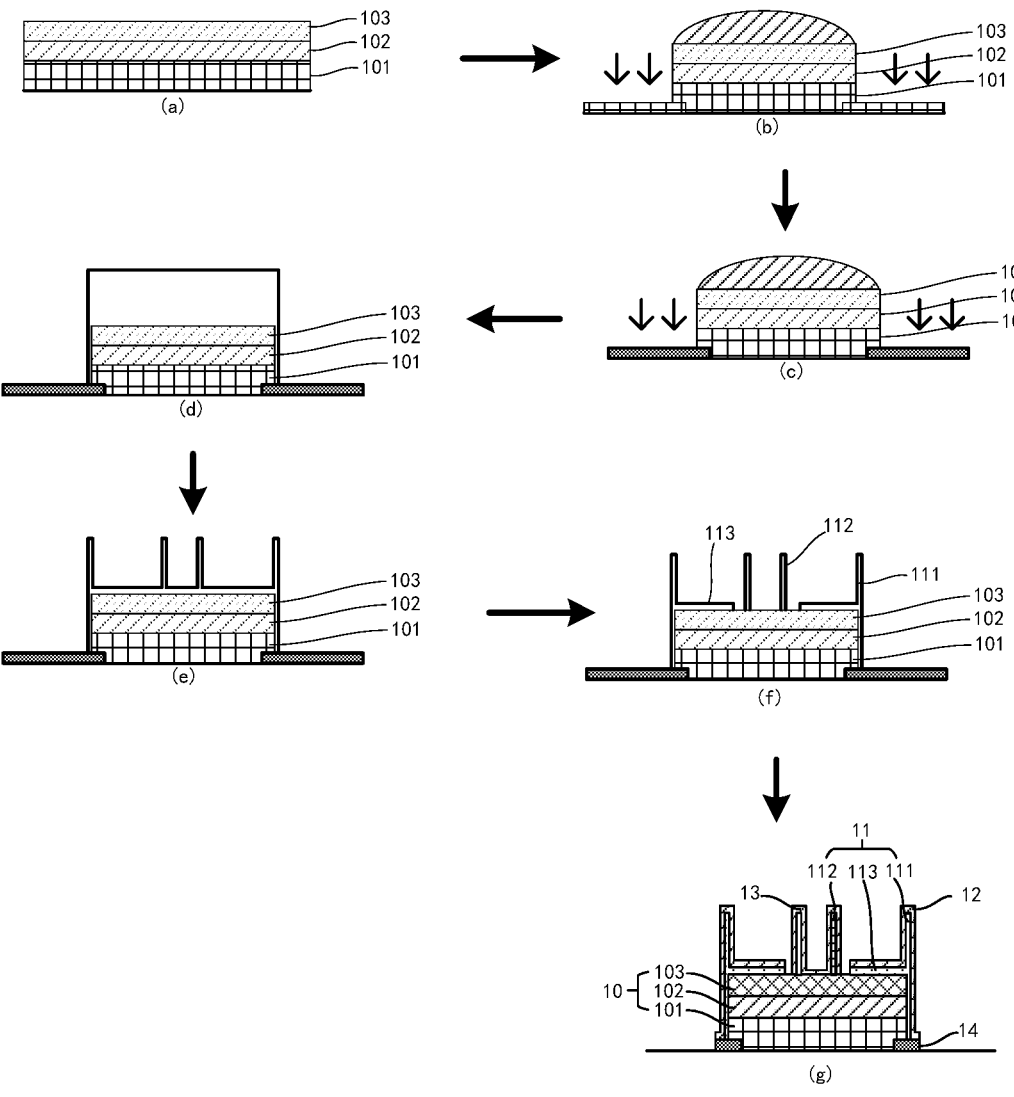
FIG. 4 (*a*) to 4 (*g*) are schematic diagrams of a process for manufacturing a light-emitting device provided by an embodiment of the present disclosure.

Reference is made to FIG. 4, which include schematic diagrams of the manufacturing process of the light-emitting device provided by the embodiments of the present disclosure.

As shown in FIG. 4, firstly, a first semiconductor layer 101, a light-emitting layer 102, and a second semiconductor layer 103 are sequentially deposited on the substrate (the substrate is not shown in the diagram).

The material for the first semiconductor layer 101 and the second semiconductor layer 103 include but are not limited to the conventional material such as GaN. The deposited layers are then patterned in a patterning process, namely, a mask pattern is formed by photolithography, and then the layers are etched down to form the patterned first semiconductor layer 101, the light-emitting layer 102, and the second semiconductor layer 103.

In an embodiment of the present disclosure, the patterning the semiconductor structure in a patterning process includes:

etching, in a direction from the second semiconductor layer to the first semiconductor layer, the second semiconductor layer, the light-emitting layer, and a part of the first semiconductor layer, so as to form the first semiconductor layer of a preset thickness on the substrate, and the manufacturing method further includes:

doping the first semiconductor layer of the preset thickness with an ion implantation process, where the implanted ions diffuse to an edge region of the first semiconductor layer, so as to form a doped structure in the first semiconductor layer, where the edge region of the first semiconductor layer is between the patterned light-emitting layer and the substrate.

In some embodiments, the preset thickness may be less than 1 μm.

In other words, when etching to the first semiconductor layer 101 the a direction from the second semiconductor layer to the first semiconductor layer, a part of the first semiconductor layer 101 is etched away, the material of the first semiconductor layer with the preset thickness remains on the substrate, and then a doping is performed on the material of the first semiconductor layer material with the preset thickness that is remained on the substrate. In some embodiments, the first semiconductor layer of the preset thickness is doped with an ion implantation process, where the implanted ions not only diffuse in the first semiconductor layer with the preset thickness, but also further diffuse to an edge region of the first semiconductor layer between the patterned light-emitting layer 102 and the substrate, and to form the doped structure in the first semiconductor layer. The conductivity of the doped first semiconductor layer material is relatively good.

In some embodiments, the method further includes: performing a high-temperature annealing treatment on the semiconductor structure on which the ion implantation process has been performed.

By performing the high-temperature annealing treatment, it may be further ensured that the implanted ions diffuse to the edge region of the first semiconductor layer between the patterned light-emitting layer 102 and the substrate.

Next, a chemical vapor deposition (CVD) process is performed to deposit the insulating medium having a relatively large thickness which is then patterned, so that the insulating medium cover the upper surface of the second semiconductor layer 103 and sidewalls of the first semiconductor layer 101, the light-emitting layer 102 and the second semiconductor layer 103. Thereafter, the insulating medium is etched to form a transition barrier structure as shown in FIG. 4 (e). The etching is continued to etch away the insulating medium in some regions (such as a region between two sub-barriers of the second barrier, and regions between the two sub-barriers and the third barrier) on the second semiconductor layer 103, so that the insulating medium that is originally continuous above the second semiconductor layer 103 is etched to be disconnected to form the insulating layer 11. The insulating layer 11 includes: a first barrier 111, a second barrier 112, and a third barrier 113. The first barrier 111 surrounds an outer sidewall of the semiconductor layer, the first barrier 111 at least partially protrudes from a surface of the second semiconductor layer 103, and the second barrier 112 at least partially protrudes from a central region of the surface of the second semiconductor layer 102. The third barrier 113 is located on the surface of the second semiconductor layer 103, and is located between the second barrier 112 and the first barrier. The third barrier 113 is spaced apart from the second barrier 112 by a distance less than a first preset threshold value, and the edge of the third barrier 113 is connected to the first barrier 111. The thickness of the insulating layer 11 may be less than 1 μm.

Thereafter, a metal material layer is deposited on the insulating layer and then patterned, to form a first electrode 12 and a second electrode 13. The first electrode 12 coats surfaces of the first barrier 111 and the third barrier 113 which are not in contact with the semiconductor structure. The first electrode 12 is connected to the first semiconductor layer 101. The second electrode 12 covers the second barrier 112, and is connected to the second semiconductor layer 103.

The metal material layer may select a metal which has a relatively high hardness and a light reflectivity greater than a third preset threshold. The higher hardness ensures a structural strength of the formed electrode, and the light reflectivity greater than the third preset threshold allows an efficient reflection of the light reaching the metal surface.

In the embodiments of the present disclosure, the first semiconductor layer material remained on the substrate is doped by the ion implantation process, where in the ion implantation process, a concentration of phosphorus in a precursor is in a range of 10% to 15%. In the CVD process, the power for CVD is in a range of 1500 kW to 2000 kW.

In the annealing treatment, the annealing temperature is in a range of 800 degrees Celsius to 1000 degrees Celsius, so as to ensure that the implanted ions diffuse to the edge region of the first semiconductor layer 101 which is between the patterned light-emitting layer 102 and the substrate. The above-mentioned doping may be a heavily doping (for example, n+).

Finally, the excess doped material is removed from the substrate, and the doped structure 14 between the edge of the patterned light-emitting layer 102 and the substrate is kept. As can be seen from FIGS. 1 and 4, the doped structure 14 is arranged to be protruded from the first semiconductor layer, and the first electrode 12 is connected to a side of the doped structure 14 close to the light-emitting layer 102 in an overlapping manner. Thus, the first electrode can be manufactured without sacrificing the light-emitting area.

In addition, by forming the doped structure 14, the contact resistance between the first electrode 12 and the first semiconductor layer 101 can be reduced, thereby improving the light-emitting efficiency of the light-emitting device.

In the method for manufacturing the light-emitting device according to the embodiments of the present disclosure, the semiconductor layer is largely surrounded when manufacturing metal electrode, and by using the metal electrode to reflect light incident on the side surface(s) and the bottom surface back, the brightness of the light-emitting device can be effectively improved without increasing the supplied power, thereby reducing the power consumption of the back plate.

Figure 5:
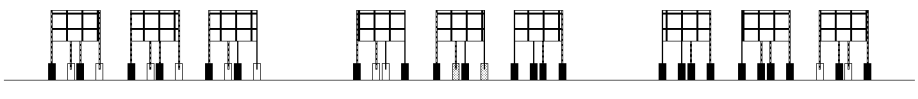
FIG. 5 is a schematic diagram showing a bonding between a light-emitting device and a display back plate provided by an embodiment of the present disclosure.

Reference is made to FIG. 5, which is a schematic diagram showing a bonding of the light-emitting device to the display back plate according to an embodiment of the present disclosure. As shown in FIG. 5, a display panel is also provided according to some embodiments of the present disclosure, which includes the light-emitting device as described in the above embodiments.

In some embodiments, the display panel further includes the display back plate and multiple light-emitting devices as mentioned above, the multiple light-emitting devices are arranged in an array on the display back plate, and each of the multiple light-emitting devices is bonded to a power supply pad on the display back plate via the first electrode and the second electrode, so that the display back plate is electrically connected with the light-emitting device.

The light-emitting device is bonded to the power supply pad on the display back plate via the first electrode and the second electrode, thereby forming an electrical connection. Various light-emitting devices are arranged in an array on the display back plate to form the display panel.

In the light-emitting device according to the above-mentioned embodiments, the semiconductor layer can be surrounded by the metal for the electrodes to a large extent. By reflecting the light incident on the side surface(s) and the bottom surface back by the metal, the brightness of the light-emitting device can be improved greatly without increasing the supplied power, thereby reducing the power consumption of the back panel. The display panel according to the embodiments of the present disclosure also possesses the above-mentioned advantages, the description of which is omitted hereby.

The foregoing is some of embodiments of the present disclosure, it should be noted that various improvements and modifications may be made by those skilled in the art without departing from the principle of the present disclosure, and such improvement and modifications also fall within the protection scope of the present disclosure.

What is claimed is:

1. A light-emitting device, comprising a semiconductor structure, wherein the semiconductor structure comprises a first semiconductor layer, a light-emitting layer, and a second semiconductor layer arranged in a stack, and the light-emitting device further comprises:

an insulating layer, wherein the insulating layer comprises a first barrier, a second barrier and a third barrier, the first barrier surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer, the third barrier is located between the second barrier and the first barrier, the third barrier is spaced apart from the second barrier by a distance, and an edge of the third barrier is connected to the first barrier;

a first electrode, wherein the first electrode covers surfaces of the first barrier and the third barrier which are not in contact with the semiconductor structure, and the first electrode is connected to the first semiconductor layer; and a second electrode, wherein the second electrode covers the second barrier and is connected to the second semiconductor layer;

wherein at least a portion of the second barrier protrudes from the surface of the second semiconductor layer in a direction away from the first semiconductor layer, and at least a portion of the second electrode protrudes from the surface of the second semiconductor layer in the direction away from the first semiconductor layer; and the second barrier is not in contact with the first electrode.

2. The light-emitting device according to claim 1, wherein the first semiconductor layer comprises a doped structure located at an edge region of the first semiconductor layer, and the first barrier surrounds a part of an outer sidewall of the first semiconductor layer close to the light-emitting layer, and surrounds an entire outer sidewall of the light-emitting layer and an entire outer sidewall of the second semiconductor layer; the first electrode is connected to the doped structure, and an outer sidewall of the doped structure is not surrounded by the first barrier.

3. The light-emitting device according to claim 2, wherein the doped structure protrudes from the first semiconductor layer in a direction of the outer sidewall of the first semiconductor layer, and the first electrode is connected with a surface of the doped structure on a side close to the light-emitting layer in an overlapping manner.

4. The light-emitting device according to claim 3, wherein the doped structure is a heavily doped structure.

5. The light-emitting device according to claim 1, wherein the first electrode and the second electrode are made of a metal having a light reflectivity of 90% or more.

6. The light-emitting device according to claim 1, wherein the first electrode and the second electrode is a single-layer structure.

7. The light-emitting device according to claim 1, wherein both the first electrode and the second electrode are a dual-layer structure, wherein one layer is a first metal layer having a light reflectivity of 90% or more, and the other layer is a second metal layer having hardness.

8. The light-emitting device according to claim 1, wherein an orthographic projection of the first electrode and an orthographic projection of the second electrode onto the surface of the second semiconductor layer occupy 90% or more of an area of a bottom surface of the second semiconductor layer.

9. The light-emitting device according to claim 1, wherein the first barrier and the third barrier are formed as an integral structure.

10. The light-emitting device according to claim 1, wherein the second barrier comprises two sub-barriers arranged at an interval.

11. The light-emitting device according to claim 1, wherein the light-emitting device has a cylindrical shape, a portion of the first electrode protruding from the surface of the second semiconductor layer has a hollow cylindrical shape, and the second electrode has a hollow cylindrical shape.

12. The light-emitting device according to claim 11, wherein an orthographic projection of the first electrode onto the substrate is a ring, an orthographic projection of the second electrode onto the substrate is a circle, and the orthographic projection of the first electrode onto the substrate surrounds the orthographic projection of the second electrode onto the substrate.

13. A method for manufacturing a light-emitting device, comprising:
    forming a first semiconductor layer, a light-emitting layer, and a second semiconductor layer sequentially on a substrate; wherein the first semiconductor layer, the light-emitting layer, and the second semiconductor layer form the semiconductor structure;
    patterning the semiconductor structure by a patterning process;
    depositing an insulating medium on the second semiconductor layer, and patterning the insulating medium to form an insulating layer, wherein the insulating layer comprises a first barrier, a second barrier and a third barrier, the first barrier surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer and is located between the second barrier and the first barrier, the third barrier is spaced apart from the second barrier by a distance, and an edge of the third barrier is connected to the first barrier; and
    depositing a metal material layer on the insulating layer, and patterning the metal material layer to form a first electrode and a second electrode, wherein the first electrode covers surfaces of the first barrier and the third barrier which are not in contact with the semiconductor structure, the first electrode is connected to the first semiconductor layer, and the second electrode covers the second barrier and is connected to the second semiconductor layer;
    wherein at least a portion of the second barrier protrudes from the surface of the second semiconductor layer in a direction away from the first semiconductor layer, and at least a portion of the second electrode protrudes from the surface of the second semiconductor layer in the direction away from the first semiconductor layer; and the second barrier is not in contact with the first electrode.

14. The manufacturing method according to claim 13, wherein the patterning the semiconductor structure with the patterning process comprises:
    etching, in a direction from the second semiconductor layer to the first semiconductor layer, the second semiconductor layer, the light-emitting layer, and a part of the first semiconductor layer sequentially to form the first semiconductor layer of a preset thickness on the substrate; and the manufacturing method further comprises:
    doping the first semiconductor layer of the preset thickness by an ion implantation process, wherein implanted ions diffuse to an edge region of the first semiconductor layer between the light-emitting layer that is patterned and the substrate, to form a doped structure in the first semiconductor layer.

15. The manufacturing method according to claim 14, further comprising:
    performing a high-temperature annealing treatment on the semiconductor structure on which the ion implantation process has been performed.

16. The manufacturing method according to claim 14, wherein in the ion implantation process, a concentration of phosphorus in a precursor is within a range of 10% to 15%, and an annealing temperature is within a range of 800 degrees Celsius to 1000 degrees Celsius.

17. A display panel, comprising a light-emitting device, wherein the light-emitting device comprises a semiconductor structure, the semiconductor structure comprises a first semiconductor layer, a light-emitting layer, and a second semiconductor layer arranged in a stack, and the light-emitting device further comprises:
    an insulating layer, wherein the insulating layer comprises a first barrier, a second barrier and a third barrier, the first barrier surrounds an outer sidewall of the semiconductor structure, at least a portion of the first barrier protrudes from a surface of the second semiconductor layer, at least a portion of the second barrier protrudes from a central region of the surface of the second semiconductor layer, the third barrier is located on the surface of the second semiconductor layer, the third barrier is located between the second barrier and the first barrier, the third barrier is spaced apart from the second barrier by a distance, and an edge of the third barrier is connected to the first barrier;
    a first electrode, wherein the first electrode covers surfaces of the first barrier and the third barrier which are not in contact with the semiconductor structure, and the first electrode is connected to the first semiconductor layer; and
    a second electrode, wherein the second electrode covers the second barrier and is connected to the second semiconductor layer;
    wherein at least a portion of the second barrier protrudes from the surface of the second semiconductor layer in a direction away from the first semiconductor layer, and at least a portion of the second electrode protrudes from the surface of the second semiconductor layer in the direction away from the first semiconductor layer; and the second barrier is not in contact with the first electrode.

18. The display panel according to claim 17, further comprising a display back plate and a plurality of light-emitting devices comprising the light-emitting device arranged in an array on the display back plate, and each of the plurality of light-emitting devices is bonded to a power supply pad on the display back plate via the first electrode and the second electrode, so as to electrically connect the display back plate to each of the plurality of light-emitting devices.

19. The display panel according to claim 17, wherein the first semiconductor layer comprises a doped structure located at an edge region of the first semiconductor layer, and the first barrier surrounds a part of an outer sidewall of the first semiconductor layer close to the light-emitting layer, and surrounds an entire outer sidewall of the light-emitting layer and an entire outer sidewall of the second semiconductor layer; the first electrode is connected to the doped structure, and an outer sidewall of the doped structure is not surrounded by the first barrier.

20. The display panel according to claim 17, wherein the doped structure protrudes from the first semiconductor layer in a direction of the outer sidewall of the first semiconductor layer, and the first electrode is connected with a surface of the doped structure on a side close to the light-emitting layer in an overlapping manner.

* * * * *